United States Patent
Gu

(10) Patent No.: US 11,426,995 B2
(45) Date of Patent: Aug. 30, 2022

(54) COATING METHOD, COATING DEVICE AND LIGHT-EMITTING DEVICE

(71) Applicant: Najing Technology Corporation Limited, Zhejiang (CN)

(72) Inventor: Xinyan Gu, Zhejiang (CN)

(73) Assignee: Nanjing Technology Corporation Limited, Zhejiang (CN)

( * ) Notice: Subject to any disclaimer, the term of this patent is extended or adjusted under 35 U.S.C. 154(b) by 237 days.

(21) Appl. No.: 16/343,417

(22) PCT Filed: Aug. 17, 2017

(86) PCT No.: PCT/CN2017/097854
§ 371 (c)(1),
(2) Date: Apr. 19, 2019

(87) PCT Pub. No.: WO2018/072545
PCT Pub. Date: Apr. 26, 2018

(65) Prior Publication Data
US 2019/0248132 A1    Aug. 15, 2019

(30) Foreign Application Priority Data
Oct. 21, 2016   (CN) .......................... 201610919798.9

(51) Int. Cl.
*B41J 2/045* (2006.01)
*H01L 51/00* (2006.01)
(Continued)

(52) U.S. Cl.
CPC ............. *B41J 2/04535* (2013.01); *B05C 5/02* (2013.01); *B05C 11/1018* (2013.01); *B41J 2/04* (2013.01); *B41J 2/165* (2013.01); *B41M 5/0047* (2013.01); *H01L 51/0003* (2013.01); *H01L 51/0005* (2013.01); *H01L 51/56* (2013.01)

(58) Field of Classification Search
CPC ............... B41J 2/04535; B41M 5/0047; H01L 51/0005
See application file for complete search history.

(56) References Cited

U.S. PATENT DOCUMENTS

2008/0299292 A1* 12/2008 Heike .................. B05C 5/0225
427/8
2010/0080912 A1    4/2010 Koyama et al.

FOREIGN PATENT DOCUMENTS

CN          1939730 A       4/2007
CN        101204874 A       6/2008
(Continued)

*Primary Examiner* — Nathan T Leong
(74) *Attorney, Agent, or Firm* — Gang Yu

(57) ABSTRACT

A coating method, a coating device and a light-emitting device, the coating method comprises: controlling an ink supply device to stop supplying ink to a micro nozzle when it is determined that the lowest end of an ink droplet from the micro nozzle reaches a first position; determining that the distance between the end of the micro nozzle and a substrate reaches a second distance, the second distance being preset; controlling the ink supply device to continue to supply ink, and controlling the micro nozzle to move relative to the substrate for a pattern coating. The disclosure provides a good pattern forming solution, thereby avoiding the technical problem in the prior art of inkjet printing apparatuses easily causing nozzle clogging.

12 Claims, 3 Drawing Sheets

(51) Int. Cl.
*B05C 11/10* (2006.01)
*B41M 5/00* (2006.01)
*H01L 51/56* (2006.01)
*B41J 2/04* (2006.01)
*B05C 5/02* (2006.01)
*B41J 2/165* (2006.01)

(56) References Cited

FOREIGN PATENT DOCUMENTS

| | | | |
|---|---|---|---|
| CN | 101907805 | A | 12/2010 |
| CN | 102351435 | A | 2/2012 |
| CN | 104353584 | A | 2/2015 |
| CN | 106564315 | A | 4/2017 |
| EP | 2946423 | A | 11/2015 |
| JP | 2012106446 | A | 6/2012 |
| WO | 03076190 | A1 | 9/2003 |

* cited by examiner

COATING METHOD, COATING DEVICE AND LIGHT-EMITTING DEVICE

CROSS-REFERENCE TO RELATED APPLICATIONS

This application is a national phase entry under 35 U.S.C. § 371 of International Patent Application PCT/CN2017/097854, filed Aug. 17, 2017, designating the United States of America and published as International Patent Publication WO 2018/072545 A1 on Apr. 26, 2018, which claims the benefit under Article 8 of the Patent Cooperation Treaty to Chinese Patent Application Serial No. 201610919798.9, filed on Oct. 21, 2016, the disclosure of which is hereby incorporated herein in its entirety by this reference.

TECHNICAL FIELD

Embodiments of the disclosure relate to a field of electronic devices, and in particular to a coating method, a coating device and a light-emitting device.

BACKGROUND

Along with the booming development of a panel display industry, people pursue high-quality image quality increasingly, a new generation display technology represented by an organic light-emitting diode (OLED) has been paid more attention. The OLED attracts the people by features of lightness and thinness, flexibility, and a wide viewing angle, but the OLED using vacuum thermal evaporation as a major manufacturing method consumes large energy in manufacture, and color accuracy may be affected by size deviation of a large-size mask. By contrast, a quantum dots light-emitting diode (QLED) manufactured by quantum dots solution through a wet coating technology is apparently more advantageous.

According to an existing relatively mature wet coating technology, such as spin coating, a material utilization rate is only about 5%, and the material utilization rate of spray coating is about 90%, but these coating processes may not directly make a pattern, a film-removing process needs to be introduced later for clearing material in corresponding positions, or a blocking mask is applied in advance before coating. Therefore, not only the material is wasted, but also the manufacturing process becomes complicated. Currently, a popular researched coating process capable of accurately preparing a patterned picture is, for example, inkjet coating, as long as a coating area is preset on a substrate, a material can accurately fall into a circle of a 'dam' formed and surrounded by a pixel defining layer, the inkjet coating may be used for preparing the pattern as precise as pixels. If an inkjet coating device can realize precise area coating, the cost of such device is every expensive, and the preparation of ink is also difficult, when the device is not matched with the ink, printed droplet will have many splashes, namely many small droplets are dispersed around the main droplet, and make the substrate polluted, and the printing quantity can not be stably controlled, in addition, when the printing is stopped, nozzles may be clogged because of evaporation of solvent.

SUMMARY

Embodiments of the disclosure provide a coating method, a coating device and a light-emitting device, and avoids a technical problem that a nozzle of an inkjet printing device is easily clogged.

According to one aspect of the embodiment of the disclosure, a coating method is provided, the method includes the following steps: an ink supply device is controlled to stop supplying ink to a micro nozzle when it is determined that a lowest end of an ink droplet from the micro nozzle reaches a first position; it is determined that a distance between an end of the micro nozzle and a substrate reaches a second distance, the second distance is preset; and the ink supply device is controlled to continue to supply ink, and the micro nozzle is controlled to move relative to the substrate for a pattern coating.

In some embodiments, before the ink supply device is controlled to stop supplying ink to the micro nozzle when it is determined that the lowest end of the ink droplet from the micro nozzle reaches the first position, the method further includes the following steps: the end of the micro nozzle is controlled to be positioned in a second position, a distance from the first position to the second position is a first distance, the first distance is preset, and the first position is below the second position relative to the substrate; the ink supply device is controlled to start supplying ink.

In some embodiments, a position of the end of the micro nozzle or the lowest end of the ink droplet is detected through at least one of the followings: a laser, an ink outlet pressure of the micro nozzle.

In some embodiments, the first distance is used for controlling a size of the ink droplet, and/or the second distance is used for controlling a height from the micro nozzle to an upper surface, away from the substrate, of a pixel separating column on the substrate, so as to enable the micro nozzle to be lifted when passing through an upper surface of the pixel separating column, and to be lowered when passing through an upper space of a naked surface of the substrate.

In some embodiments, the second distance is less than or equal to the first distance, and the second distance is greater than 0.

In some embodiments, the second distance is used for controlling a line width of a pattern coated by an ink droplet.

In some embodiments, the method further includes the following steps: after coating is completed, the micro nozzle is lifted, and the ink supply device is controlled to stop supplying ink when the distance between the end of the micro nozzle and the substrate is greater than the second distance.

According to another aspect of the disclosure, a coating device is further provided, the device includes an object carrying platform, used for carrying a substrate; at least one micro nozzle, used for discharging ink, and controlled to move relative to the substrate for a pattern coating; a distance determining device, used for determining a distance from an end of the micro nozzle to the substrate; an ink supply device, used for supplying ink to at least one micro nozzle, the distance, from the end of the micro nozzle to the substrate, determined by the distance determining device is the basis for supplying ink.

In some embodiments, the distance determining device includes at least one of the followings: a laser positioning device, and an ink outlet pressure detecting device for at least one micro nozzle.

In some embodiments, the laser positioning device includes a first laser positioning device and a second laser positioning device, a laser emitted by the first laser positioning device includes an upper laser and a lower laser.

In some embodiments, the upper laser is used for positioning the end of the micro nozzle, and the lower laser is used for positioning the lowest end position of an ink droplet.

In some embodiments, the second laser positioning device is used for determining the distance from the end of the micro nozzle to the substrate.

In some embodiments, an inner diameter of the micro nozzle is from 1 micrometer to 1 millimeter.

In some embodiments, the inner diameter of the micro nozzle and the line width of a coating pattern are in a ratio of 1:0.5 to 1:1.5.

In some embodiments, surfaces of an outer wall and the end of the micro nozzle are provided with coatings of which a surface tension is lower than a threshold value, the threshold value is a minimum surface tension enabling the ink droplet to wet the surfaces of the outer wall and the end of the micro nozzle.

According to yet another aspect of the disclosure, a light-emitting device is further provided, the light-emitting device is manufactured by using a method, the method includes the following steps: an ink supply device is controlled to stop supplying ink to a micro nozzle when it is determined that a lowest end of an ink droplet from the micro nozzle reaches a first position; it is determined that a distance between an end of the micro nozzle and a substrate reaches a second distance, the second distance is preset; and the ink supply device is controlled to continue to supply ink, and the micro nozzle is controlled to move relative to the substrate for a pattern coating.

In the embodiment of the disclosure, the ink supply device is controlled to stop supplying ink to the micro nozzle when it is determined that the lowest end of an ink droplet from the micro nozzle reaches the first position; after it is determined that the distance between the end of the micro nozzle and the substrate reaches the preset second distance, the ink supply device is controlled to continue to supply ink, and the micro nozzle is controlled to move relative to the substrate for a pattern coating. Applying the technical scheme of the present disclosure, the size of the ink droplet from the micro nozzle is firstly controlled, and it is controlled whether the ink is supplied to the micro nozzle based on the distance between the end of the micro nozzle and the substrate, so it is guaranteed that the micro nozzle in a continuous ink supplying state during a coating process, compared with the existing pattern coating on the substrate by using the inkjet coating method, a phenomenon that an ink outlet of a device is easily clogged in an uncontinuous ink supplying process is avoided, and the clogging probability of the ink outlet of the nozzle is reduced in the pattern coating, so a technical problem that the nozzle is easily clogged by using an inkjet printing device in the prior art is avoided, and a preferable replacement scheme is provided.

BRIEF DESCRIPTION OF THE DRAWINGS

The accompanying drawings, which constitute a part of this application, are used to provide a further understanding of the disclosure, and the exemplary embodiments of the disclosure and the description thereof are used to explain the disclosure, but do not constitute improper limitations to the disclosure. In the drawings.

DETAILED DESCRIPTION OF THE EMBODIMENTS

In order to make those skilled in the art to understand the scheme of the disclosure better, the technical scheme in the embodiment of the disclosure is clearly and completely described below in combination with the drawings in the embodiment of the disclosure, apparently, the described embodiments are only a part of the embodiments of the disclosure, but are not all of the embodiments. Based on the embodiments in the disclosure, all other embodiments acquired by those of ordinary skill in the art under the precondition without the creative work fall within the scope of protection of the disclosure.

It is to be noted that terms 'first', 'second' and the like in the description and claims and the above drawings of the disclosure are used for distinguishing similar objects, and are not intended to describe a specific sequence or a precedence order. It is to be understood that such used data may be interchanged in a proper situation, so that the embodiments of the disclosure described herein may be implemented in sequences besides those graphically-represented or described herein. Besides, terms 'include' and 'have' and any variations thereof are intendent to cover the non-exclusive inclusion.

Figure 1:
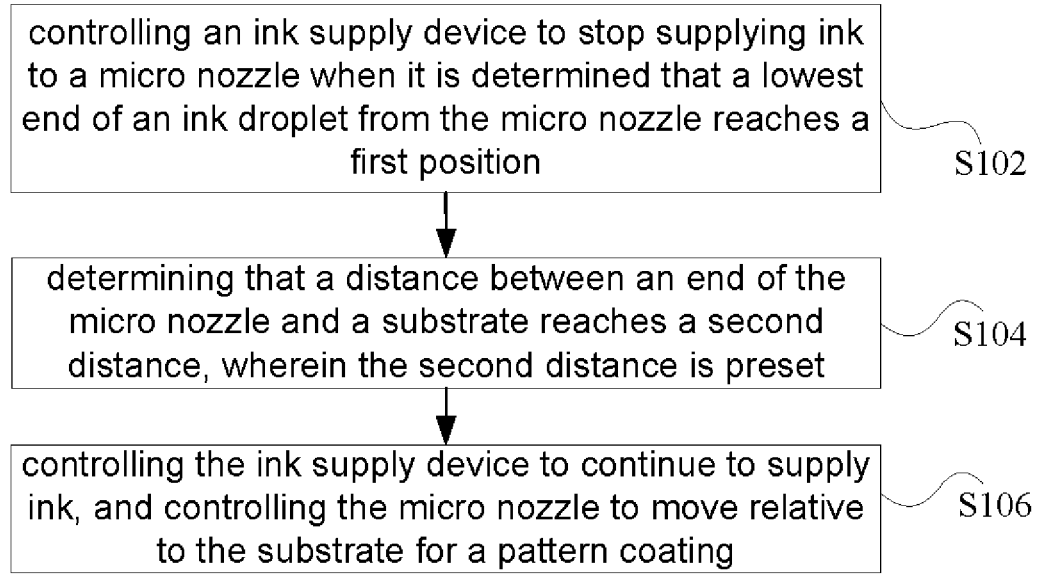
FIG. 1 is a flow diagram of a coating method according to the embodiment of the disclosure.

A coating method is provided in the embodiment, FIG. 1 is a flow diagram of the coating method according to the embodiment of the disclosure, as shown in FIG. 1, the process includes the following steps:

step S102, an ink supply device is controlled to stop supplying ink to a micro nozzle 40 when it is determined that a lowest end of an ink droplet 50 from the micro nozzle 40 reaches a first position;

step S104, it is determined that the distance between an end of the micro nozzle 40 and a substrate 20 reaches a second distance, the second distance is preset; and step S106, the ink supply device is controlled to continue to supply ink, and the micro nozzle 40 is controlled to move relative to the substrate 20 for a pattern coating.

Through the above steps, a position of the lowest end of the ink droplet 50 may be controlled by the first position firstly, so the size of the ink droplet 50 is controlled, the coating may be performed after the ink droplet 50 reaches the proper size, in a coating process, the substrate and the micro nozzle 40 are in a non-contact way, an ink outlet of the end of the micro nozzle 40 may not be damaged in the coating process, and the micro nozzle 40 for coating is guaranteed not to be clogged to a certain extent through firstly discharging ink droplet 50, a phenomenon that a pattern line is non-uniform or non-complete caused by the clogged nozzle or micro nozzle 40 in coating process is avoided, it is known from the above that the coating method uses the above steps, the size of the ink droplet 50 is firstly controlled and then the coating is performed, which is beneficial to protect the ink outlet of the micro nozzle 40, for example, the probability of clogging the ink outlet of the micro nozzle may be reduced to a certain extent, and a better coating scheme is provided.

Specifically, applying the technical scheme of the present disclosure, the size of the ink droplet 50 from the micro nozzle 40 is firstly controlled, and it is controlled whether the ink is supplied to the micro nozzle 40 based on the distance from the end of the micro nozzle 40 to the substrate 20, so it is guaranteed that the micro nozzle 40 is in a continuous ink supplying state during the coating process (the distance from the micro nozzle 40 to the substrate 20 is less than or equal to the second distance in the coating process), and in multiple times of the non-continuous coating, before each time of the coating, the ink droplet 50 is discharged from the end of the micro nozzle 40, and then coating is performed, it is guaranteed that the ink droplet 50 stays suspended at the micro nozzle before the coating, the end of the micro nozzle 40 is in a wet state, compared with the existing pattern coating on the substrate 20 by using an inkjet coating method, a phenomenon that the ink outlet of a device is easily clogged in the uncontinuous ink supplying process is avoided, and a clogging probability of the ink outlet of the nozzle is reduced in the pattern coating, so the technical problem that the nozzle is easily clogged by using an inkjet printing device in the prior art is avoided, and a preferable solution is provided.

The first position in the above embodiments may further control the size of the ink droplet from the micro nozzle 40, namely control the distance from the lowest end of the ink droplet 50 to the end of the micro nozzle 40, the larger the distance from the first position to the end of the micro nozzle 40 along a vertical direction is, the more quantity of the ink droplet 50 will flow out, and the larger the distance from the lowest end of the ink droplet 50 to the end of the micro nozzle 40 is; otherwise, the shorter distance from the first position to the end of the micro nozzle 40 along the vertical direction is, the less quantity of the ink droplets 50 is, and the shorter distance from the lowest end of the ink droplet 50 to the end of the micro nozzle 40 is.

In one or more optional embodiments, the line width of the pattern coated by the micro nozzle may be greater than or equal to an inner diameter of the micro nozzle 40.

In an optional embodiment, before the ink supply device is controlled to stop supplying ink to the micro nozzle 40 when it is determined that the lowest end of the ink droplet 50 from the micro nozzle 40 reaches the first position, the method further includes the following steps: the end of the micro nozzle 40 is controlled to be positioned in the second position, the distance from the first position to the second position is the first distance, the first distance is preset, and the first position is below the second position relative to the substrate 20; and the ink supply device is controlled to supply ink. The first distance in the above embodiments is used for controlling the size of the ink droplet 50, and/or, the second distance is further used for controlling the height from the micro nozzle to the upper surface, away from the substrate 20, of a pixel separating column on the substrate, so as to enable the micro nozzle to be lifted when passing through the upper surface of the pixel separating column, and lowered when passing through the naked surface of the substrate 20.

The substrate 20 in the above embodiments may be a substrate 20 with a flat surface, or a substrate 20 of which the surface is provided with a concave-convex structure. When the substrate 20 is the substrate of which the surface is provided with the concave-convex structure, for example a TFT substrate 20 provided with multiple pixel separating columns, namely provided with multiple grooves, it only needs to determine whether the distance from the end of the micro nozzle 40 to the naked surface (the concave-convex structure formed by two pixel separating columns, namely the bottom of a sub-pixel area) of the substrate 20 reaches the second distance. When the micro nozzle 40 is coating, it is only guaranteed that the end of the micro nozzle 40 without contacting with the upper surface, away from the substrate, of the pixel separating column of the substrate 20.

The area on which the pixel separating columns between the above two grooves is disposed belongs to a non-coating area generally, when the micro nozzle 40 passes through the pixel separating column between the two grooves, it means that the coating is in a stage that the coating of the first groove has ended and the coating of the second groove just begins, at this time, the actual distance from the end of the micro nozzle 40 to the naked surface of the substrate 20 is D1, the above second distance (a setting distance) is D2, the height of the pixel separating column between the two grooves is D3, the first situation is: D2 is greater than D3, D1 may be controlled so that D2 is greater than D1 and D1 is greater than D3, so the micro nozzle 40 continuously supplies the ink, the advantage is that the process of coating the substrate 20 may be regarded as a continuous coating process, the ink is continuously supplied, the coating is rapid and easy to control, and the pixel separating column may achieve an effect of cutting off the ink droplet 50, so the ink droplet 50 may not adhere to the surface of the pixel separating column and may fall into the bottom surface of the groove; the second situation is: D2 is less than or equal to D3, D1 can be controlled so that D2 is less than or equal to D3 and D3 is less than D1, after the first groove is coated, in order to avoid the micro nozzle 40 contacting or colliding with the pixel separating column, the end of the micro nozzle 40 may be controlled to be lifted and higher than the pixel separating column, in a preferable embodiment, the ink supply device may be controlled to stop supplying ink.

Further, the above ink droplet 50 may be liquid containing a light-emitting material, the light-emitting material may be quantum dot, a fluorescent powder, a fluorescent nano micro-sphere (a mixture of the quantum dots and a fluorescent substance), an organic light-emitting material, or may be an electronic transporting material, an electronic injection material, a hole transporting material, a hole injection material, an electrode material and the like. A viscosity range of a coating material, namely composition of the ink droplet 50, may be between 1 and 30 cps, preferably 1-10 cps, material with foresaidviscosity range has the advantage of enabling the coating to be more easily controlled, the difficultly that the ink droplet is discharged from the end of the micro nozzle or the phenomenon that the micro nozzle is clogged because of the overlarge viscosity is avoided. The foresaid pattern may be a pattern in the sub-pixel areas formed by the pixel separating columns. The foresaid pixel separating column is not limited to a separating structure of which the sidewall profile is column-shaped, or may be the separating structures in other shapes which are generally used for separating the sub-pixel areas, for example, a pixel defining layer, a black matrix etc. . . .

Initial formation of the ink droplet 50 of the micro nozzle 40 may be in any position, as an optional implementation mode, firstly whether the end of the micro nozzle 40 is positioned in the second position is detected, under the condition that the end of the micro nozzle 40 being not positioned in the second position is detected, the end of the above micro nozzle 40 is controlled to be positioned in the second position, when the end of the micro nozzle 40 is positioned in the second position, the ink is then supplied. Herein, the distance from the first position to the second position may be regarded as the first distance, the first distance may be preset. The first distance may be determined based on the actual requirement. Because the first distance represents the distance from the beginning part (a position of the lowest end of the initially formed ink droplet) of the ink droplet 50 to the ending part (a position of the lowest end of the finally formed ink droplet), in an optional implementation mode, the size of the ink droplet 50 may be related to the first distance, if the larger ink droplet 50 is expected to be acquired, the first distance may be increased, if the smaller ink droplet 50 is expected to be acquired, the first distance may be decreased.

There are multiple detecting methods, for example, a position of the end of the micro nozzle 40 or the lowest end of the ink droplet 50 is detected through at least one of the followings: a laser, or an ink outlet pressure of the micro nozzle 40. The laser detection may be the better method, with relatively better precision, and may be used in practical application.

Because the first distance represents the size of the ink droplet 50, so in an optional implementation mode, the second distance may be determined by using the first distance, for example, the second distance may be less than or equal to the first distance, and the second distance is greater than 0. Such setting may enable the coating to be accurate relatively.

The second distance is further used for controlling the height from the micro nozzle to the upper surface away from the substrate 20 of the pixel separating column on the substrate 20, so as to enable the micro nozzle to be lifted when passing through the upper surface of the pixel separating column, and lowered when passing through the upper space of the naked surface of the substrate 20.

In an optional embodiment, the distance from the micro nozzle 40 to the naked surface of the substrate 20 provided with multiple pixel separating columns is controlled at the second distance, and the distance from the micro nozzle 40 to the upper surface, away from the substrate 20, of the multiple pixel separating columns is also controlled at the second distance, namely the micro nozzle 40 is lifted at the position of the pixel separating column, and then lowered to the position of the substrate 20 without the pixel separating column, the naked surface of the substrate 20 may be the upper surface of the substrate 20 (may be provided with a layered structure) which is not provided with the pixel separating columns.

In one or more optional embodiments, the above substrate 20 may be a narrowly defined or a broadly defined substrate, a broadly defined substrate is a substrate of which the surface is processed, for example, a substrate provided with the layered structure, namely the substrate 20 includes the substrate and the above layered structure, preferably, the layered structure may be layered structure one or more combinations of an electrode layer, a functional layer, and a light-emitting layer. In one or more preferable embodiments, the naked surface of the substrate 20 may be understood as the partial surface of the substrate which is not provided with the pixel separating columns, under the condition that the substrate 20 includes the substrate and the layered structure disposed on the surface, the naked surface of the substrate 20 may be the partial surface of the substrate with the layered structure which is not provided with the pixel separating column, namely the surface of the layered structure.

Specifically, because the coated substrate 20 may have two situations: under the condition that the substrate 20 with the flat surface is coated, the surface of the substrate is not provided with the pixel separating column, the ink is supplied to the micro nozzle 40 when the distance from the end of the micro nozzle 40 to the substrate 20 be controlled at the second distance, and the micro nozzle 40 is controlled to move relative to an extending direction of the substrate 20 for a pattern coating; if the substrate 20 with the pixel separating column is coated, the pixel separating column may be any shapes and heights, for example in an electroluminescence device, the height of the pixel separating column may be about 1.5 micrometers, the section may be trapezoidal, like a reservoir dam, the bottom surface of the groove formed in the middle may be the substrate 20 provided with a ITO electrode surface, the ink droplet 50 from the end of the micro nozzle 40 coats on the substrate 20, provided with the ITO electrode surface, of the bottom face of the groove, the substrate 20 may be provided with the pixel separating column, besides, may be further provided with other separating structure for other purposes, the height of superposed both the pixel separating column and other separating structure may be higher, for example, the other separating structure is 2 micrometers, the superposed height is 3.5 micrometers. In order to adapt the different shapes of the pixel separating columns or the pixel separating structures, in the above step S106 of the coating method, controlling the micro nozzle 40 to move relative to the substrate 20 for a pattern coating, parameters of the width of each pixel groove and the height of the pixel separating column may be firstly obtained, and based on the above parameters, a moving route of the end of the micro nozzle 40 in XYZ direction is calculated.

In an optional embodiment, a line width of the coated pattern may be 2 micrometers, the micro nozzle 40 may be with 3 micrometers of the inner diameter, when pixels (namely an area on which the substrate 20 is positioned, surrounded by the pixel separating columns) in rows are coated, in order to avoid the end of the micro nozzle 40 from colliding with the pixel separating column or other separating structure on the substrate 20, the second distance may be controlled, so the height from the micro nozzle 40 to the pixel separating column on the substrate 20 is controlled, the micro nozzle 40 may be controlled to be lifted at the position of the pixel separating column, and lowered at the position of the substrate 20. When one pattern is coated on the substrate 20, the micro nozzle 40 needs to be slightly lifted, moved, and lowered, and move forward to coating the next pattern.

In another optional embodiment, the line width of the coated pattern may be controlled through selecting the micro nozzles 40 of the different inner diameters, for example, if a line width expected to be coated is still 2 μm, the micro nozzle 40 with 10 micrometers of the inner diameter may be selected, so the micro nozzle 40 only needs to be descended for a short distance, making the shortest distance from the end of the micro nozzle 40 to the substrate 20 be less than or equal to the second distance, and the width of the contact surface of the ink droplet 50 and the substrate 20 is controlled at 2 micrometers, such line width may satisfy the expectation, the coating may be continuously performed; for example, if the line width expected to be coated is still 2 μm, the micro nozzle 40 with 1.7 micrometers of the inner diameter may be selected, so the micro nozzle 40 is descended for a long distance, making the shortest distance from the end of the micro nozzle to the substrate be less than or equal to the second distance, the ink droplet from the end of the micro nozzle 40 bears a common pressure from the substrate and the end of the micro nozzle, the width of the contact surface of the ink droplet 50 and the substrate 20 is slightly greater than the inner diameter of the micro nozzle 40, the width of the contact surface may reach 2 micrometers, the requirement of the above line width may be satisfied. Because the substrate 20 and the separating structure (the material may be resin or other suitable materials) have different surface chemical properties generally, the coated material may be prevented from adhering to the surface of the separating structure.

As an optional implementation mode, the second distance may be used for controlling the line width of the pattern coated by the ink droplet 50, for example, the second distance is shorter, the line width may be wider, otherwise, narrower, in such way the line width may be controlled.

Specifically, in the embodiment, under the condition that the second distance is larger, then the contact surface of the ink droplet 50 and the substrate 20 is smaller, then the line width of the coating is narrower; under the condition that the second distance is smaller, namely the end of the micro nozzle 40 is very close to the substrate 20, then the line width of the coating is wider.

As an optional implementation mode, the inner diameter of the micro nozzle 40 is from 1 micrometer to 1 millimeter, preferably the inner diameter of the micro nozzle 40 and the line width of the coating pattern are in a ratio of 1:0.5 to 1:1.5. So on the one hand, the stability of the coating is improved, when position (in a coating process) of the micro nozzle relative to the substrate is fluctuated, the line width of the coating may not have the same extent fluctuation, on the other hand, the controllability of the ink droplet 50 is improved, the phenomenon that the ink droplet may not be stably controlled in the coating process caused by the line width of the coating exceeding the inner diameter of the micro nozzle and the ink droplet 50 being 'too flat' by extrusion is avoided.

Through the above optional implementation modes, a problem that the line width in the coating process is difficult to control may be solved, in an optional implementation mode, a step of controlling to stop supplying ink after the end of the coating may be further added, for example, after the coating is completed, the micro nozzle 40 is lifted (namely the micro nozzle 40 is controlled to move away from the substrate), and the ink supply is stopped when the distance from the end of the micro nozzle 40 to the substrate 20 is greater than the second distance. Therefore, the control of stopping supplying ink for coating may be more accurate to a certain extent.

Figure 2:
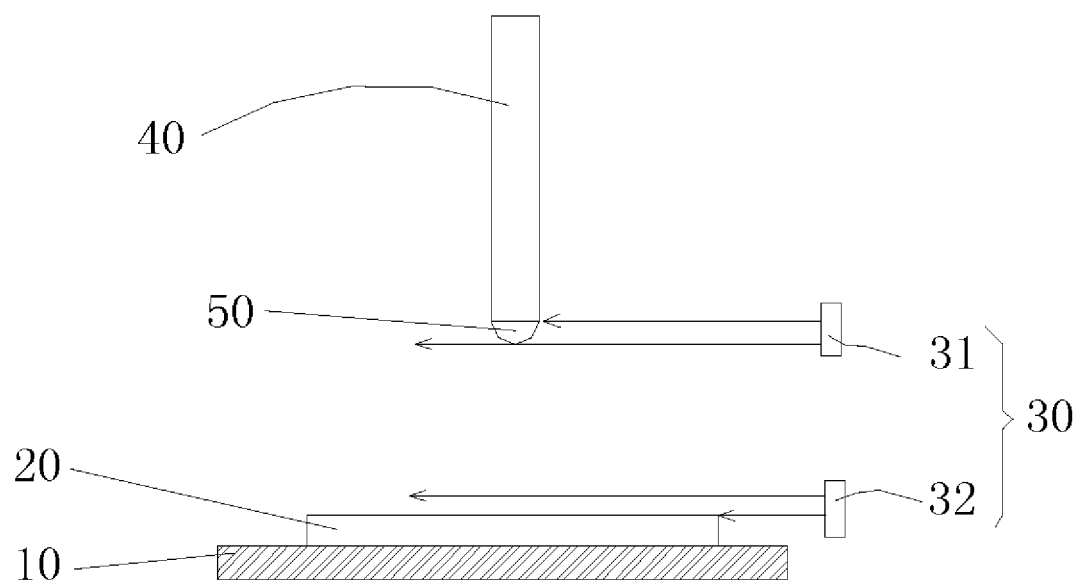
FIG. 2 is a block diagram of a coating device according to the embodiment of the disclosure.

In the embodiment, a coating device is further provided, FIG. 2 is a block diagram of the coating device according to the embodiment of the disclosure, as shown in FIG. 2, the device includes:

at least one micro nozzle 40, used for supplying ink, and controlled to move relative to a substrate 20 for a pattern coating;

an object carrying platform 10, used for placing the substrate 20;

a distance determining device, used for determining a distance from the end of the micro nozzle 40 to the substrate 20 (laser positioning is used in the diagram, this is only an implementation mode, other types of positioning devices may be further used. In a laser positioning process, a laser positioning group may be used, such mode is more accurate, certainly other positioning modes may be used too); and an ink supply device (not shown in FIG. 2), used for supplying ink to at least one micro nozzle 40, wherein the distance, from the end of the micro nozzle 40 to the substrate 20, determined by the distance determining device is the basis for supplying ink, namely, the ink is supplied to at least one micro nozzle 40 based on the distance from the end of the micro nozzle 40 to the substrate 20 determined by the distance determining device.

Through the above device, the distance from the micro nozzle 40 to the substrate 20 is detected, and the coating is performed by controlling the size of the ink droplet 50. Such implementation is beneficial to protect the ink outlet of the micro nozzle 40, a probability of clogging the micro nozzle 40 by the ink droplet 50 due to the early volatilization of a solvent may be reduced to a certain extent, so a better coating scheme is provided.

The effects of the following optional embodiments have been discussed in the above method, and not described repeatedly herein.

As an optional implementation mode, the distance determining device includes at least one of the followings: a laser positioning device 30, and an ink outlet pressure detecting device of at least one micro nozzle 40.

As an optional implementation mode, the laser positioning device 30 includes a first laser positioning device 31 and a second laser positioning device 32, wherein a laser emitted by the first laser positioning device 31 includes an upper laser and a lower laser.

As an optional implementation mode, the upper laser is used for positioning the end of the micro nozzle 40, and the lower laser is used for positioning a lowest end position of an ink droplet 50.

As an optional implementation mode, the second laser positioning device 32 is used for determining the distance from the end of the micro nozzle 40 to the substrate 20.

As an optional implementation mode, an inner diameter of the micro nozzle 40 is from 1 micrometer to 1 millimeter, preferably a ratio range of the inner diameter of the micro nozzle 40 and the line width of the coating pattern are in a ratio of 1:0.5 to 1:1.5.

The adjustment of the above ratio range may be realized by controlling the following factors: the size of the ink droplet 50 discharged from the end of the micro nozzle 40, the distance from the end of the micro nozzle 40 to the substrate 20 in the coating process, a moving speed of the micro nozzle 40 in the coating process, the viscosity of the ink droplet 50 and the like. For example, the above inner diameter and the above line width are in a ratio of 1:1.5, the first distance may be controlled to be half of the inner diameter, so the discharged ink droplet 50 is larger, and the distance from the end of the micro nozzle 40 to the substrate 20 in the coating process is controlled to be shorter, and a material with smaller viscosity is used for forming the ink droplet 50, so in the coating process, the width of the contact surface of the ink droplet 50 and the substrate may be widened because the extrusion force of the substrate 20 and the end of the micro nozzle 40 is applied to the ink droplet 50, meanwhile, along with the movement of the micro nozzle 40, the ink supply device continuously supplies the ink so that the ink supply of the micro nozzle 40 is sufficient, and the viscosity of the ink droplet 50 is small, making the diffusion easy, so the above ratio of 1:1.5 can be realized; likewise, the above factors may be also adjusted for realizing a ratio of 1:0.5 of the inner diameter and the line width, it is not described repeatedly herein.

As an optional implementation mode, the outer wall and the cross section of the micro nozzle 40 are coated by paint of which a surface tension is lower than a threshold value, the threshold value is a minimum surface tension of coatings enabling the ink droplet 50 to wet the surfaces of the outer wall and the end of the micro nozzle 40.

The above optional implementation mode is described below in combination with an optional embodiment.

The device may include the following parts:
1. a micro nozzle 40 (may be a plurality of micro nozzles);
2. a moving device capable of controlling the micro nozzle 40 to move along XYZ axis;

3. an object carrying platform 10 (further preferably the object carrying platform 10 which may be accurately movable along the XYZ axis) for placing a substrate 20;

4. a laser positioning device 30 (two pairs, one pair is used for a micro nozzle 40 in position, namely laser positioning group 1; and one pair is positioned in a direction of a coating plane perpendicular to the micro nozzle 40, namely laser positioning group 2);

a laser positioning replacement scheme: if other modes (for example, ink outlet pressure detection etc.) are used for controlling the suspension of the ink droplet 50 so as to realize the coating, it may be also predicted; and 5. an ink supply device (not shown in FIG. 2).

Figure 3:
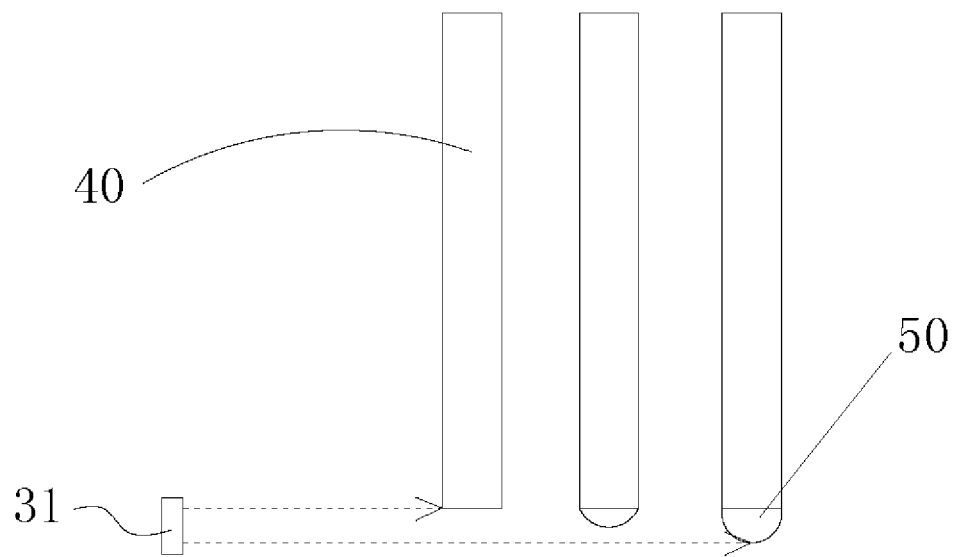
FIG. 3 is a schematic diagram of a micro nozzle in position according to the embodiment of the disclosure.

The coating process of the embodiment may be as follows:

First, the micro nozzle 40 being in position, FIG. 3 is a schematic diagram of the micro nozzle in position according to the embodiment of the disclosure, it is described below in combination with FIG. 3.

The upper and lower lasers of the laser positioning group 1, namely the first laser positioning device 31 are opened, the upper and lower lasers are as shown by dotted lines in FIG. 3, the upper dotted line represents the upper laser, the upper laser is aligned to the end of the micro nozzle 40, the ink supply device begins supplying ink, the ink droplet 50 is discharged from the end of the micro nozzle 40, the lower dotted line in FIG. 3 represents the lower laser, when the lower laser detects a lowest end position of the ink droplet 50, the ink supply device stops supplying ink, a distance between the upper and lower lasers is regarded as a preset value 1, the preset position 1 is equivalent to the above first distance.

The preset value 1 is preset, the size of the suspended ink droplet 50 is indirectly controlled by the preset value 1. When the ink droplet 50 is suspended and the micro nozzle is not descended for coating, the solvent is volatilized making the ink droplet 50 shrunk, when the lower laser does not detect the lowest end of the ink droplet 50, the ink supply device continues to supply ink, the ink droplet 50 is grown, until the lower laser can monitor a signal of the lowest end of the ink droplet 50. Such mechanism is capable of effectively preventing the micro nozzle 40 from being clogged.

Figure 4:
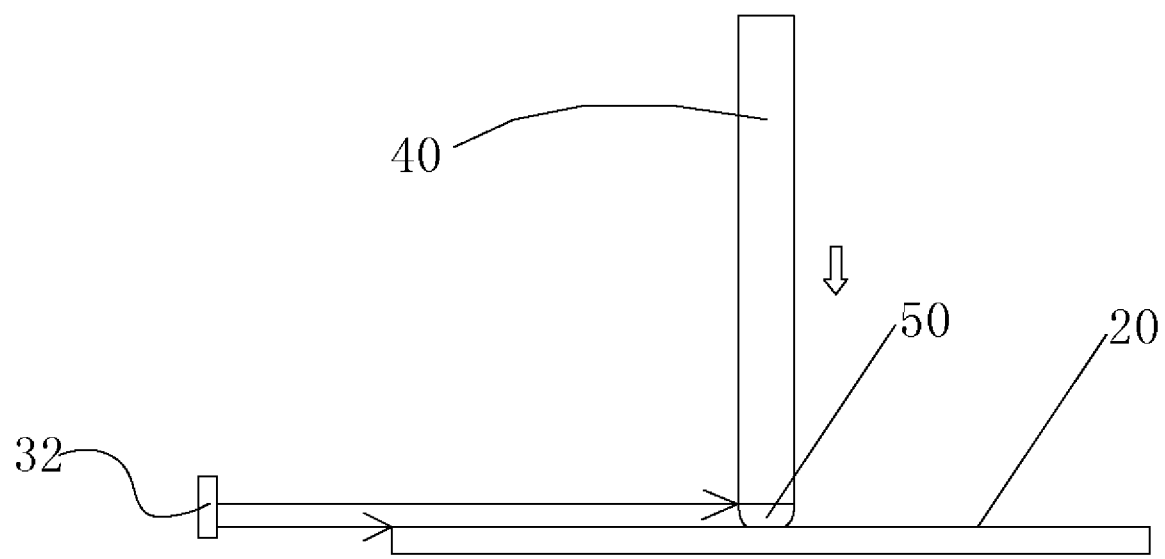
FIG. 4 is a schematic diagram of coating according to the embodiment of the disclosure.

Second, coating, FIG. 4 is a schematic diagram of the coating according to the embodiment of the disclosure, it is described below in combination with FIG. 4.

The coating begins, the micro nozzle 40 is lowered, a falling direction is as shown by an arrow in FIG. 4, the lowest end of the suspended ink droplet 50 contacts with the substrate 20, when the laser positioning group 2 (namely, the second laser positioning device 32) detects that the distance from the end of the micro nozzle 40 to the substrate 20 is a preset value 2 (corresponding to the second distance), the ink supply device begins supplying ink; under the control of the moving device capable of moving along the XYZ axis, the micro nozzle 40 coats the corresponding pattern according to the requirement.

For example: preset value 2 is above zero, and the preset value 2 is less than or equal to the preset value 1 (it may be considered as point contact when two values are equal), if the substrate 20 is provided with a preset concave-convex structure, the micro nozzle 40 is lifted, so that the micro nozzle 40 is guaranteed not to collide with the substrate 20 and the concave-convex structure.

The preset value 2 is also preset, the value indirectly controls the line width of the pattern coated by the ink droplet 50.

Figure 5:
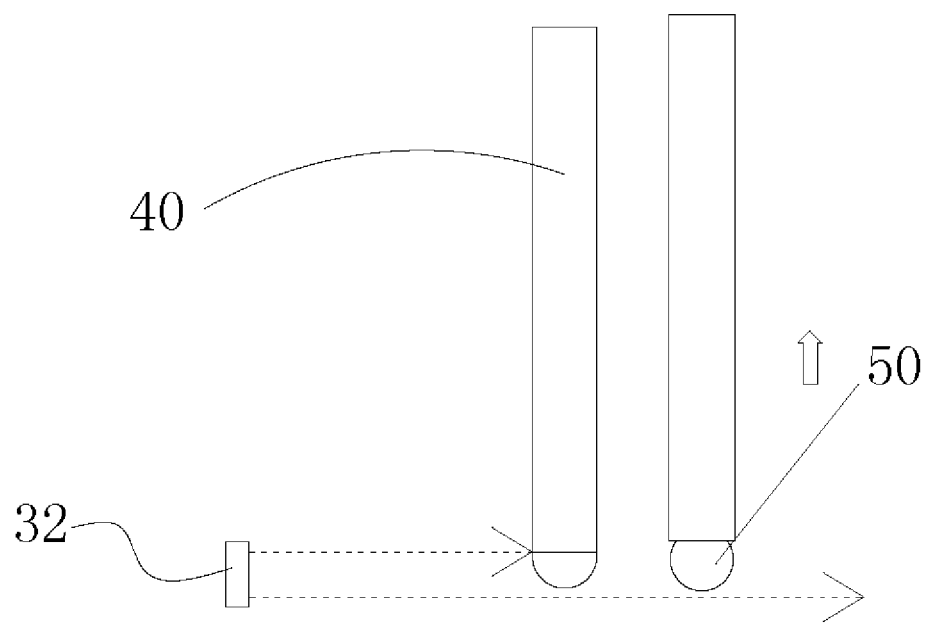
FIG. 5 is a schematic diagram at the end of the coating according to the embodiment of the disclosure.

Third, end of the coating, FIG. 5 is a schematic diagram at the end of the coating according to the embodiment of the disclosure, it is described below in combination with FIG. 5.

The coating ends, the micro nozzle 40 is lifted, and a lifting direction is as shown by an arrow in FIG. 5, when the upper laser of the laser positioning group 2 does not detect the signal of the micro nozzle 40 (namely the distance between the end of the micro nozzle 40 and the substrate is greater than the preset value 2), the ink supply device stops supplying ink.

An inner diameter range of the micro nozzle 40 in the above embodiments may be 1 μm to 1 mm, preferably the inner diameter of the micro nozzle 40 and the line width of the coating pattern are in a ratio of 1:0.5 to 1:1.5.

A viscosity range of a coating material is 1-30 cps, preferably 1-10 cps.

In the above embodiments, by selecting the micro nozzle 40 in different inner diameters, a contact area of the ink droplet 50 and the substrate 20 is controlled, and the patterns in the different widths may be coated. When the micro nozzle 40 in position begins coating, the end of the micro nozzle 40 is firstly controlled to discharge ink droplet 50 with a certain size, and the coating is performed, and the coating of the micro nozzle 40 ends, a time difference may exist between a moment when the ink droplet 50 of the end of the micro nozzle 40 does not contact with the substrate 20 and a moment when the micro nozzle 40 is lifted until the ink supply is stopped, during this period, the end of the micro nozzle 40 may still suspend the ink droplet 50 because of the ink supply, since the ink droplet 50 is suspended at the end of the micro nozzle 40 during the whole process from the micro nozzle 40 in position to the end of the coating, the ink outlet of the micro nozzle 40 is not easily clogged. Multiple micro nozzles 40 may be used for simultaneously coating the different types of coatings and the patterns in different line widths, more accurate pattern is coated in the above embodiment, instead of whole surface coating. Compared with the inkjet coating capable of accurately coating the pattern, the ink outlet (namely the above end of the micro nozzle) of the micro nozzle 40 is not easily clogged by foresaid method.

In the above embodiments of the disclosure, the description of each embodiment focuses to the different aspects, the part, which is not described in detail in a certain embodiment, may refer to the related descriptions of other embodiments.

In some embodiments provided by the application, it is to be understood that the disclosed technical content may be implemented through other modes. The above embodiments of the described device are merely schematic, for example, division of the above units may be a logic functional division, another division mode may exist when the division is practically realized, for example, multiple units or components may be combined or integrated to another system, or some characters may be omitted, or not executed.

The above described units as a separating part may be or may not be divided physically, the units as a display part may be or may not be a physical unit, namely may be positioned in a place, or may be distributed to multiple units. According to the actual requirement, partial or all units may be selected for realizing a purpose of the scheme of the embodiment.

The technical scheme of the disclosure is used for realizing the following technical effects:

Depending on the size of the ink droplet 50 of the lower end of the micro nozzle 40, and the size of aperture of the micro nozzle 40, the pattern coating may be conveniently performed by using the method; and because the ink droplet 50 stays suspended at the lower end of the micro nozzle 40, when the volume of ink droplet 50 is decreased because of the volatilization of the solvent of the ink droplet 50, the supply device may continue to supply ink so that the ink droplet 50 recovers to an original volume, so the ink outlet of the micro nozzle 40 is not easily clogged.

The disclosure further includes a light-emitting device, the light-emitting device is manufactured by using the above method. The above method may be used for manufacturing the light-emitting device in low cost.

The above is only the preferable implementation modes of the disclosure, it is to be noted by those of ordinary skill in the art that a plurality of improvements and modifications may be made under the precondition without departing from the principle of the disclosure, these improvements and modifications may be considered as the scope of protection of the disclosure.

What is claimed is:

1. A coating method, comprising:
   controlling an ink supply device to stop supplying ink to a micro nozzle (40) when it is determined that a lowest end of an ink droplet (50) from the micro nozzle (40) reaches a first position;
   before controlling the ink supply device to stop supplying ink to the micro nozzle (40) when it is determined that the lowest end of the ink droplet (50) from the micro nozzle (40) reaches the first position, the method further comprises: controlling the end of the micro nozzle (40) to be positioned in a second position, wherein a distance from the first position to the second position is a first distance, the first distance is preset, and the first position is below the second position relative to a substrate (20); and controlling the ink supply device to start supplying ink;
   determining that a distance between an end of the micro nozzle (40) and the substrate (20) reaches a second distance, wherein the second distance is preset, and the second distance is used for controlling a line width of the pattern coated by the ink droplet (50); and
   controlling the ink supply device to continue to supply ink, and controlling the micro nozzle (40) to move relative to the substrate (20) for a pattern coating, the distance between the end of the micro nozzle (40) and the substrate (20) is less than or equal to the second distance in the coating process.

2. The method as claimed in claim 1, wherein a position of the end of the micro nozzle (40) or the lowest end of the ink droplet (50) is detected through at least one of the following: a laser, an ink outlet pressure of the micro nozzle (40).

3. The method as claimed in claim 1, wherein the first distance is used for controlling a size of the ink droplet (50), and/or the second distance is used for controlling a height from the micro nozzle (40) to an upper surface, away from the substrate (20), of a pixel separating column on the substrate (20), so as to enable the micro nozzle (40) to be lifted when passing through an upper surface of the pixel separating column, and to be lowered when passing through an upper space of a naked surface of the substrate (20).

4. The method as claimed in claim 1, wherein the second distance is less than or equal to the first distance, and the second distance is greater than 0.

5. The method as claimed in claim 1, further comprising:
   after coating is completed, lifting the micro nozzle (40), and controlling the ink supply device to stop supplying ink when the distance between the end of the micro nozzle (40) and the substrate (20) is greater than the second distance.

6. The method as claimed in claim 1, wherein the method is coating by a coating device, the coating device comprising:
   an object carrying platform (10), used for carrying a substrate (20);
   at least one micro nozzle (40), used for discharging ink, and controlled to move relative to the substrate (20) for a pattern coating;
   a distance determining device, used for determining a distance from an end of the micro nozzle (40) to the substrate (20), wherein the distance determining device comprises a laser positioning device (30), the laser positioning device (30) comprises a first laser positioning device (31), wherein a laser emitted by the first laser positioning device (31) comprises an upper laser and a lower laser, wherein the upper laser is used for positioning the end of the micro nozzle (40), and the lower laser is used for positioning a lowest end position of an ink droplet (50); and
   an ink supply device, used for supplying ink to the at least one micro nozzle (40), wherein the distance, from the end of the micro nozzle (40) to the substrate (20), is determined by the distance determining device as a basis for supplying ink.

7. The method as claimed in claim 6, wherein the distance determining device comprises: an ink outlet pressure detecting device for the at least one micro nozzle (40).

8. The method as claimed in claim 6, wherein the laser positioning device (30) comprises a second laser positioning device (32).

9. The method as claimed in claim 8, wherein the second laser positioning device (32) is used for determining the distance from the end of the micro nozzle (40) to the substrate (20).

10. The method as claimed in claim 6, wherein an inner diameter of the micro nozzle (40) is from 1 micrometer to 1 millimeter.

11. The method as claimed in claim 6, wherein surfaces of an outer wall and the end of the micro nozzle (40) are provided with coatings of which a surface tension is lower than a threshold value, the threshold value is a minimum surface tension enabling the ink droplet (50) to wet the surfaces of the outer wall and the end of the micro nozzle (40).

12. The method as claimed in claim 6, wherein a ratio range of the inner diameter of the micro nozzle (40) and a line width of a coating pattern is 1:0.5 to 1:1.5.

\* \* \* \* \*

UNITED STATES PATENT AND TRADEMARK OFFICE
CERTIFICATE OF CORRECTION

| | |
|---|---|
| PATENT NO. | : 11,426,995 B2 |
| APPLICATION NO. | : 16/343417 |
| DATED | : August 30, 2022 |
| INVENTOR(S) | : Xinyan Gu |

It is certified that error appears in the above-identified patent and that said Letters Patent is hereby corrected as shown below:

On the Title Page

Item (73), change the assignee's name from "Nanjing Technology Corporation Limited" to "Najing Technology Corporation Limited".

Signed and Sealed this
Fourteenth Day of February, 2023

Katherine Kelly Vidal
*Director of the United States Patent and Trademark Office*